(12) United States Patent
Nishikawa et al.

(10) Patent No.: US 8,530,913 B2
(45) Date of Patent: Sep. 10, 2013

(54) LIGHT EMITTING DEVICE

(75) Inventors: Yukie Nishikawa, Fukuoka-ken (JP);
Takashi Kataoka, Kanagawa-ken (JP);
Hironori Yamasaki, Fukuoka-ken (JP);
Hisashi Mori, Fukuoka-ken (JP);
Kazunari Yabe, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 53 days.

(21) Appl. No.: 13/019,681

(22) Filed: Feb. 2, 2011

(65) Prior Publication Data
US 2012/0025233 A1    Feb. 2, 2012

(30) Foreign Application Priority Data
Jul. 28, 2010  (JP) .................................. 2010-169320

(51) Int. Cl.
*H01L 33/00* (2010.01)
*H01L 33/60* (2010.01)

(52) U.S. Cl.
USPC ............... 257/95; 257/94; 257/96; 257/98; 257/101; 257/E33.027; 257/E33.043; 438/29; 438/69; 438/689

(58) Field of Classification Search
USPC .............. 257/94, 95, 96, 98, 101, E33.027, 257/E33.043; 438/29, 69, 689
See application file for complete search history.

(56) References Cited

U.S. PATENT DOCUMENTS

| | | | | |
|---|---|---|---|---|
| 8,198,645 | B2* | 6/2012 | Sakai | 257/98 |
| 8,350,277 | B2* | 1/2013 | Konno | 257/95 |
| 2008/0093612 | A1* | 4/2008 | Konno et al. | 257/96 |
| 2009/0014734 | A1* | 1/2009 | Nishikawa et al. | 257/95 |
| 2009/0075412 | A1* | 3/2009 | Lee et al. | 438/29 |

FOREIGN PATENT DOCUMENTS

JP    2006-128227    5/2006

* cited by examiner

*Primary Examiner* — Dao H Nguyen
(74) *Attorney, Agent, or Firm* — White & Case LLP

(57) ABSTRACT

According to one embodiment, a light emitting device includes a light emitting layer, a first electrode, a first and second layers, and a cladding layer. The first layer has a first impurity concentration of a first conductivity type, and allows a carrier to be diffused in the light emitting layer. The second layer has a second impurity concentration of the first conductivity type higher than the first impurity concentration, and includes a first and second surfaces. The first surface is with the first layer. The second surface has a formation region and a non-formation region of the first electrode. The non-formation region includes convex structures with an average pitch not more than a wavelength of the emission light. The cladding layer is provided between the first layer and the light emitting layer and has an impurity concentration of the first conductivity type.

15 Claims, 10 Drawing Sheets

LIGHT EMITTING DEVICE

CROSS-REFERENCE TO RELATED APPLICATIONS

This application is based upon and claims the benefit of priority from the prior Japanese Patent Application No. 2010-169320, filed on Jul. 28, 2010; the entire contents of which are incorporated herein by reference.

FIELD

Embodiments described herein relate generally to a light emitting device.

BACKGROUND

Light emitting devices used for illumination devices, display devices, traffic lights, sensor devices, and so on are increasingly required to achieve higher output.

A current spreading layer having high impurity concentration can be provided between the light emitting layer and the first electrode. Then, carriers injected from the first electrode are easily spread in the plane of the current spreading layer and the light emitting layer to emit light with high optical output.

Furthermore, fine concave-convex structures can be formed at the surface of the current spreading layer on the light emitting side. This can improve the light extraction efficiency and increase the optical output. The dry etching method can be used to form the fine uneven surface with the concave-convex structures. By using the dry etching method, a fine uneven surface having a size equal to or less than the wavelength of the emission light can be reliably formed with high productivity.

However, use of the dry etching method may result in crystalline defects or damage in the processed region. This may decrease the optical output by long-term operation.

DETAILED DESCRIPTION

In general, according to one embodiment, a light emitting device includes a light emitting layer, a first electrode, a first layer, a second layer, and a cladding layer. The light emitting layer is capable of emitting emission light. The first layer is provided between the light emitting layer and the first electrode, has a first impurity concentration of a first conductivity type, and allows a carrier injected from the first electrode to be spread in an in-plane direction of the light emitting layer. The second layer is provided between the first layer and the first electrode, has a second impurity concentration of the first conductivity type higher than the first impurity concentration, and includes a first surface and a second surface on an opposite side of the first surface. The first surface is with the first layer. The second surface has a formation region and a non-formation region of the first electrode. The non-formation region of the first electrode includes convex structures with an average pitch not more than a wavelength of the emission light. The cladding layer is provided between the first layer and the light emitting layer and has an impurity concentration of the first conductivity type.

Embodiments of the invention will now be described with reference to the drawings.

Figure 1A:
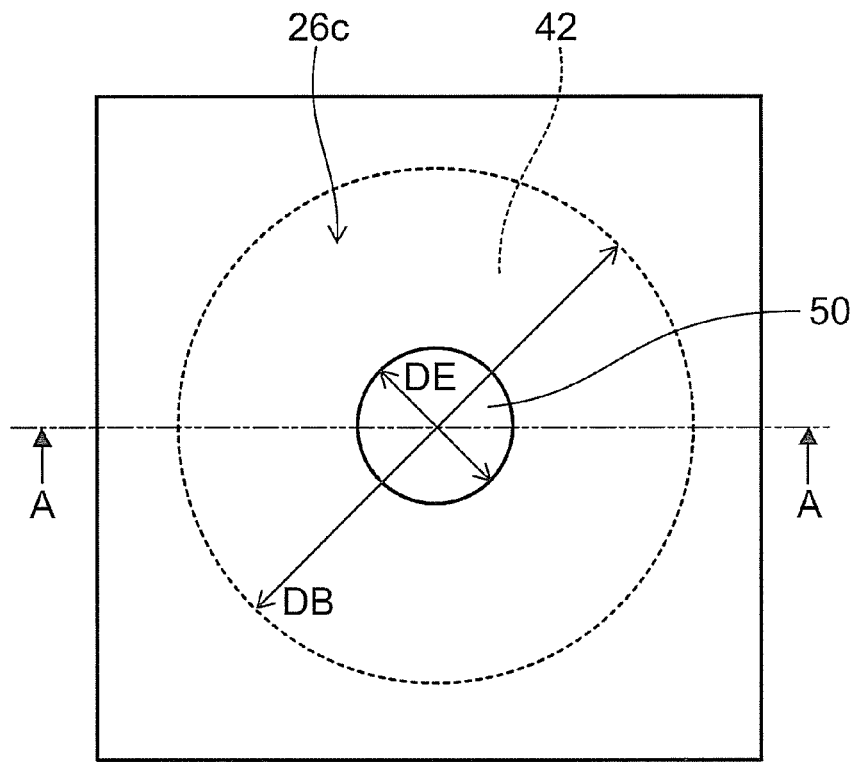
FIG. 1A is a schematic plan view of a light emitting device according to a first embodiment.
Figure 1B:
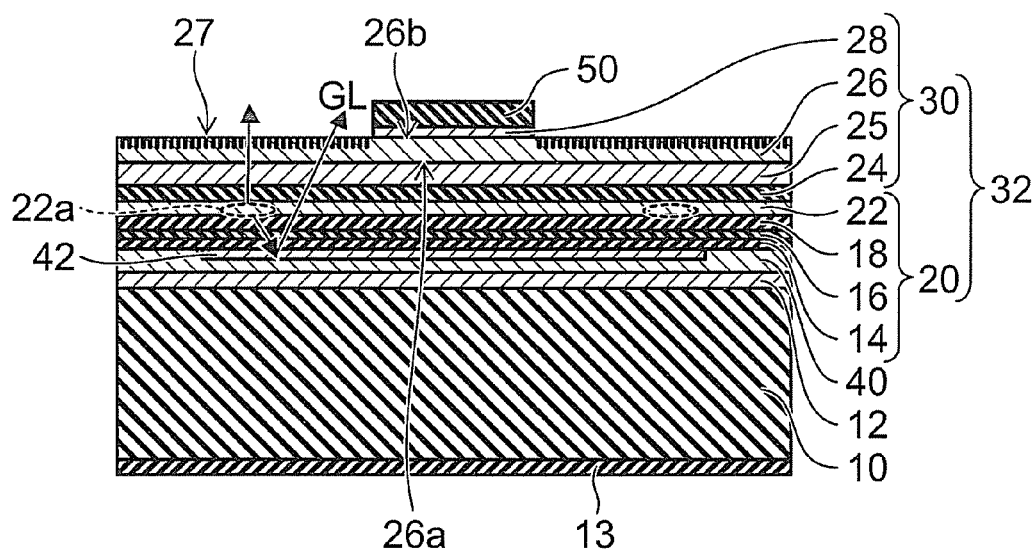
FIG. 1B is a schematic cross-sectional view taken along line A-A.

FIG. 1A is a schematic plan view of a light emitting device according to a first embodiment of the invention, and FIG. 1B is a schematic cross-sectional view taken along line A-A. The light emitting device includes a stacked body 32, a first electrode 50 provided above the stacked body 32, and a second electrode 40 and a substrate 10 provided below the stacked body 32.

The stacked body 32 includes a light emitting layer 22, a first conductivity type layer 30 provided above the light emitting layer 22, and a second conductivity type layer 20 provided below the light emitting layer 22. The first conductivity type layer 30 includes at least a first layer 25 provided above the light emitting layer 22 and a second layer 26 provided above the first layer 25. More preferably, the first conductivity type layer 30 includes a contact layer 28 above the second layer 26, because a good ohmic contact can be formed with the first electrode 50. More preferably, the first conductivity type layer 30 includes a cladding layer 24 with the light emitting layer 22 because carriers and light can be effectively confined in the light emitting layer 22 to increase the light emission efficiency.

The second layer 26 and the first layer 25 both have the first conductivity type. The first layer 25 has a first impurity concentration, and the second layer 26 has a second impurity concentration. The first impurity concentration of the first layer 25 is lower than the second impurity concentration of the second layer 26. The first surface 26a is with the first layer 25. The second surface of the second layer 26 on an opposite side of the first surface 26a has a formation region 26b and a non-formation region 26c of the first electrode 50. The non-formation region 26c of the first electrode includes the convex structures 27. The average pitch of the convex structures 27 is preferably smaller than the wavelength of the emission light. The average pitch of the convex structures 27 will be described later in detail.

Furthermore, the light emitting device may include a current blocking layer 42. The current blocking layer 42 is provided with part of the surface of the second conductivity type layer 20 on an opposite side of the light emitting layer 22. The outer edge of the current blocking layer 42 is located outward from the outer edge of the first electrode 50 in a plan view. In this case, the second electrode 40 is provided on the surface of the current blocking layer 42 on an opposite side of the second conductivity type layer 20, and with a region of the surface of the second conductivity type layer 20 not with the current blocking layer 42. Part of the light emitted downward from the light emitting layer 22 includes light GL. Part of the light GL is reflected by the current blocking layer 42. The rest part of the light GL is transmitted through the protruding region of the current blocking layer 42 made of a transparent insulating film. The light GL is then reflected by the second electrode 40, again transmitted through the current blocking layer 42, and emitted upward. By widening the region between the outer edge of the current blocking layer 42 and the outer edge of the first electrode 50, the optical output can be further increased. For instance, the diameter DE of the first electrode 50 is set to 120 µm, and the diameter DB of the current blocking layer 42 is set to 220 µm.

Figure 2A:
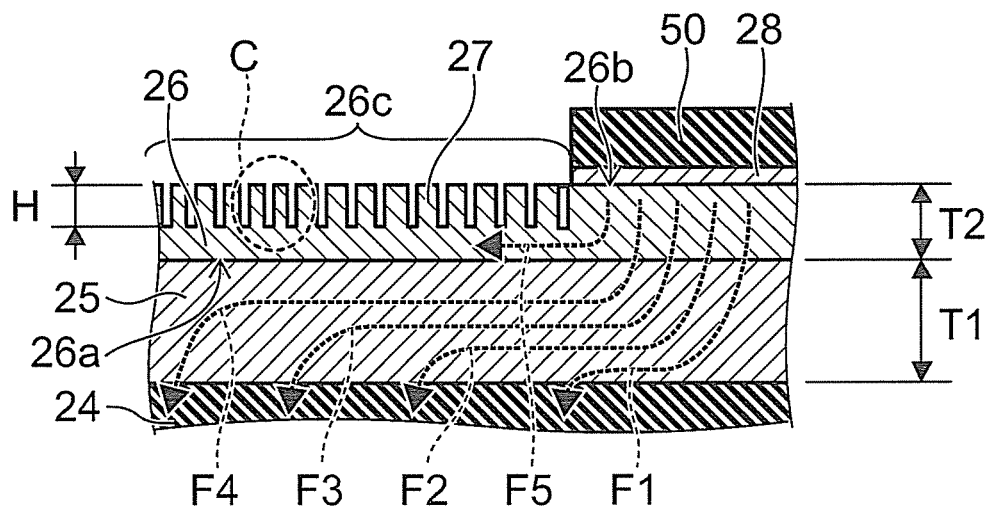
FIG. 2A is a schematic cross-sectional view of a first conductivity type layer including convex structures.
Figure 2B:
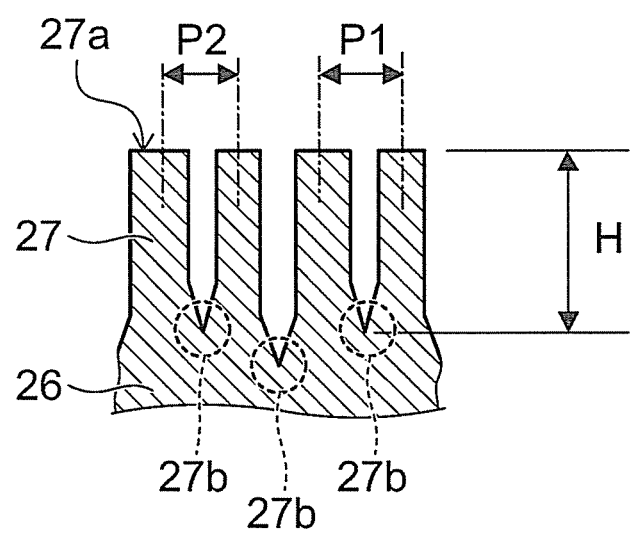
FIG. 2B is a partially enlarged view of the convex structures.

FIG. 2A is a schematic cross-sectional view of the first conductivity type layer including the island-like convex structures, and FIG. 2B is a partially enlarged view of portion C.

The thickness of the second layer 26 is denoted by T2, and the thickness of the first layer 25 is denoted by T1. The convex structures 27 are provided in the second surface of the second layer 26. In the case where the convex structures 27 are shaped like a plurality of islands, the height H is made smaller than the thickness T2 of the second layer 26 so that the bottom portion 27b around the convex structures 27 does not reach the first surface 26a. Alternatively, the convex structures 27 may be shaped like a mesh with bottom portions provided around the convex structures 27. The mesh-like convex structures 27 will be described later.

In the case of a plurality of the island-like convex structures 27, the minimum of the distances from one island to the islands therearound is defined as pitches P1, P2, etc. In defining the distance for randomly shaped islands, the island is replaced by a circle having an equal area of the island, and the distance is defined as the distance between the centers of the circles. The average value of the pitches is defined as the average pitch of the island-like convex structures 27.

In the case where the refractive index outside of the light emitting device is lower than the refractive index of the second layer 26, the refractive index of the second layer 26 including the island-like convex structures 27 has a refractive index decreasing gradually from the refractive index of the second layer 26 toward the refractive index outside of the light emitting device. Thus, the light extraction efficiency can be increased. Furthermore, the island-like convex structures 27 act as a grating, and part of the n-th order diffracted light (n=±1, ±2, ... ) can be extracted. Thus, the light extraction efficiency can be further increased.

Carriers are injected from the first electrode 50 formed above the first electrode formation region 26b of the second layer 26, and flow along with carrier flows F1, F2, F3, F4, etc. The carrier flows F1, F2, F3, F4, etc. pass through the second layer 26 having the second impurity concentration N2 and flow into the first layer 25. The non-formation region of the first electrode 50 in the second layer 26 (26c) includes the convex structures 27. Hence, the carrier flow F5 flows into the first layer 25 while horizontally spreading between the bottom portions 27b provided around the convex structures 27 and the first surface 26a of the second layer 26. That is, the first layer 25 and part of the second layer 26 act as a current spreading layer. By increasing the impurity concentration of the current spreading layer, the current can be spread in the plane of the current spreading layer and the light emitting layer 22, and the optical output can be increased. Furthermore, also by increasing the thickness of the current spreading layer, the carriers can be spread in the plane of the current spreading layer and the light emitting layer 22, and the optical output can be increased.

On the other hand, if the impurity concentration of the current spreading layer exceeds a prescribed range, impurity energy levels are formed in the band gap. This may increase optical absorption of the current spreading layer and decrease the optical output.

The convex structures 27 having an average pitch smaller than the wavelength of the emission light can be formed by the dry etching method such as RIE (reactive ion etching) with e.g. a self-assembled pattern of block copolymers used as a mask.

The block copolymer can be prepared by mixing polystyrene-polymethylmethacrylate (PS-PMMA) and PMMA homopolymer in equal amount in a solvent of PS homopolymer and propylene glycol monoether acetate (PGMEA). The block copolymer is applied onto a wafer with a uniform thickness by using e.g. a spin coater. Subsequently, heating treatment such as baking or annealing is performed. Then, PS and PMMA can be phase-separated. That is, PS and PMMA are aggregated in a self-assembled manner to form a particulate PS layer. Here, by varying the composition ratio of PS to PMMA, the particle diameter and the particle occupancy rate of the PS layer can be varied. Subsequently, RIE is performed. Then, PMMA is selectively etched away, and the PS layer remains as island-like convex structures with an average pitch range of e.g. 10 to 300 nm. Furthermore, the pattern of the PS layer is used as a mask to form a mask of e.g. a $SiO_2$ film. The $SiO_2$ film is used as a mask to perform the dry etching of the current spreading layer. Then, desired convex structures 27 can be formed. Here, a resist pattern may be used as a mask to perform the dry etching method.

However, the dry etching process may induce damage such as crystalline defects depending on the processing condition. This may decrease the optical output by the current operations. The inventors have found that in the case of forming convex structures by the dry etching method, this damage can be reduced by increasing the impurity concentration of the processed region.

Based on this knowledge, in this embodiment, the second impurity concentration N2 of the second layer 26 is made equal to or more than a prescribed concentration, and the convex structures 27 are formed in the second layer 26 by the dry etching method. Furthermore, the first impurity concentration N1 of the first layer 25 is made lower than the second impurity concentration N2 of the second layer 26 and made equal to or more than a prescribed concentration. This can suppress the increase of optical absorption of the current spreading layer while maintaining the current spreading effect. By keeping a current spreading effect in the plane of the light emitting layer 22, the influence of the processing damage of the convex structures 27 can be reduced.

The stacked body 32 including the light emitting layer 22 can include $In_x(Ga_yAl_{1-y})_{1-x}P$ (where $0≦x≦1$, $0≦y≦1$) or $Al_xGa_{1-x}As$ ($0≦x≦1$). For instance, the light emitting layer 22 and the cladding layer 24 can each be made of $In_x(Ga_yAl_{1-y})_{1-x}P$ (where $0≦x≦1$, $0≦y≦1$). At least one of the first layer 25 and the second layer 26 can be made of $Al_xGa_{1-x}As$ ($0≦x≦1$), and the other can be made of $In_x(Ga_yAl_{1-y})_{1-x}P$ (where $0≦x≦1$, $0≦y≦1$)(except the case where both are made of $Al_xGa_{1-x}As$ ($0≦x≦1$)). Furthermore, the stacked body 32 can include $In_xGa_yAl_{1-x-y}N$ (where $0≦x≦1$, $0≦y≦1$, $x+y≦1$).

Next, a second embodiment is described. In this embodiment, the stacked body 32 is made of an InGaAlP-based material represented by the composition formula $In_x(Ga_yAl_{1-y})_{1-x}P$ (where $0≦x≦1$, $0≦y≦1$). In FIGS. 1A and 1B, the stacked body 32 includes a first conductivity type layer 30, a light emitting layer 22, and a second conductivity type layer 20, which are grown in this order by the MOCVD (metal organic chemical vapor deposition) method or the MBE (molecular beam epitaxy) method on e.g. a GaAs substrate (not shown).

The first conductivity type layer 30 includes a GaAs contact layer 28 (impurity concentration of $1.0×10^{18}$ cm$^{-3}$, thickness of 0.1 μm), a first layer 25 made of $In_{0.5}(Ga_{0.7}Al_{0.3})_{0.5}P$, a second layer 26 made of $In_{0.5}(Ga_{0.6}Al_{0.4})_{0.5}P$, and a cladding layer 24 made of $In_{0.5}Al_{0.5}P$ (impurity concentration of $4×10^{17}$ cm$^{-3}$, thickness of 0.6 μm).

The light emitting layer 22 has e.g. an MQW (multi-quantum well) structure including well layers made of $In_{0.5}(Ga_{0.9}Al_{0.1})_{0.5}P$ (thickness of 8 nm) and barrier layers made of $In_{0.5}(Ga_{0.4}Al_{0.6})_{0.5}P$ (thickness of 5 nm). For instance, the number of wells is set in the range of 30 to 60. The number of barriers is then made one more than the number of wells, and is set in the range of 31 to 61.

The second conductivity type layer 20 includes e.g. a cladding layer 18 made of $In_{0.5}Al_{0.5}P$ (impurity concentration of $3×10^{17}$ cm$^{-3}$, thickness of 0.6 μm), a current spreading layer 16 made of $In_{0.5}(Ga_{0.7}Al_{0.3})_{0.5}P$ (impurity concentration of $4×10^{17}$ cm$^{-3}$, thickness of 0.2 μm), and a contact layer 14 made of $Al_{0.5}Ga_{0.5}As$ (impurity concentration of $9×10^{18}$ cm$^{-3}$, thickness of 0.2 μm).

A first electrode 50 is provided above the contact layer 28. The contact layer 28 is removed in the non-formation region of the first electrode 50. That is, in the second surface of the second layer 26, the non-formation region of the first electrode 50 is exposed, and the region 26b provided with the contact layer 28 and the first electrode 50 is not exposed. Convex structures 27 are formed in the non-formation region of the electrode 50.

The second electrode 40 above the GaAs substrate is bonded with the first electrode formed on a substrate 10 (e.g. conductive Si). Then, the GaAs substrate is removed. A substrate second electrode 13 is provided on the rear surface of the substrate 10.

Figure 3A:
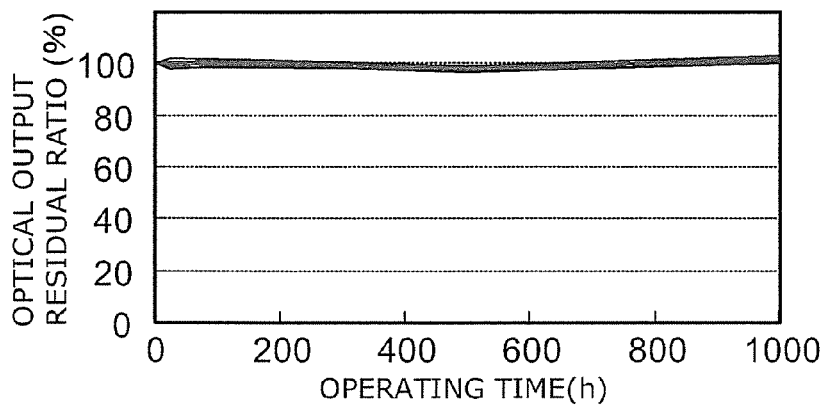
FIG. 3A shows the optical output residual ratio of a light emitting device of a second embodiment.
Figure 3B:
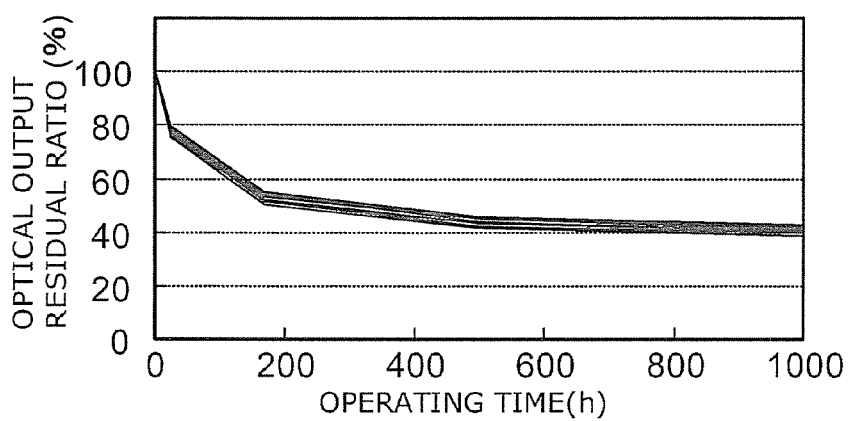
FIG. 3B shows the optical output residual ratio of a first comparative example.
Figure 3C:
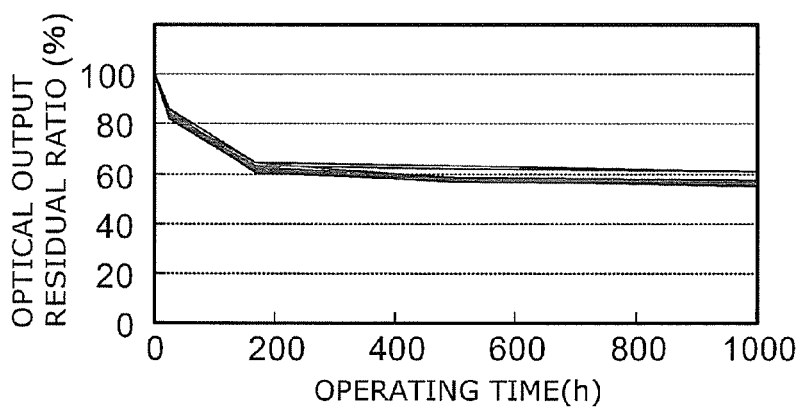
FIG. 3C shows the optical output residual ratio of a second comparative example.
Figure 3D:
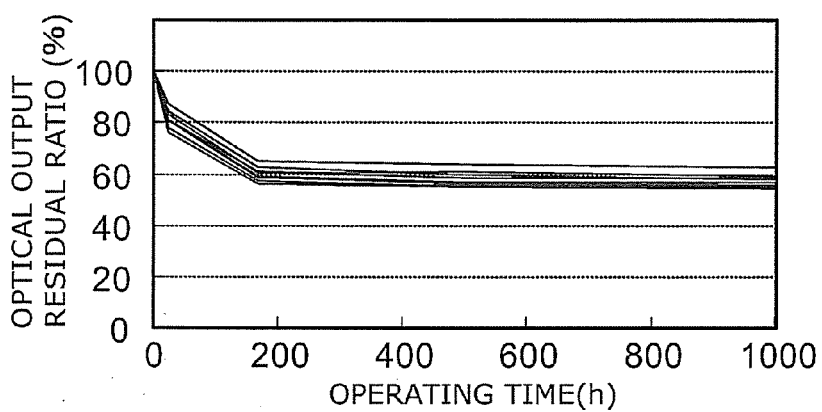
FIG. 3D shows the optical output residual ratio of a third comparative example.

FIG. 3A shows the optical output residual ratio of the light emitting device of the second embodiment. FIG. 3B shows the optical output residual ratio of a first comparative example. FIG. 3C shows the optical output residual ratio of a second comparative example. FIG. 3D shows the optical output residual ratio of a third comparative example.

The vertical axis represents the optical output residual ratio (%), and the horizontal axis represents the operating time (h). The optical output residual ratio (%) is defined as the ratio of the optical output changing with the operation to the optical output before the operation, which is considered to be 100%. The operating current was set to 50 mA in all cases.

FIG. 3A shows the optical output residual ratio of the InGaAlP-based light emitting device of the second embodiment. The second layer 26 was made of n-type $In_{0.5}(Ga_{0.6}Al_{0.4})_{0.5}P$. The second impurity concentration N2 was set to $30×10^{17}$ cm$^{-3}$, and the thickness T2 was set to 1 μm. The first layer 25 was made of n-type $In_{0.5}(Ga_{0.7}Al_{0.3})_{0.5}P$. The first impurity concentration N1 was set to $8×10^{17}$ cm$^{-3}$, and the thickness T1 was set to 3 μm. Furthermore, the height H of the convex structures 27 was set to 0.5 μm. Even after 1000 hours operation, the optical output was scarcely decreased.

Figure 4A:
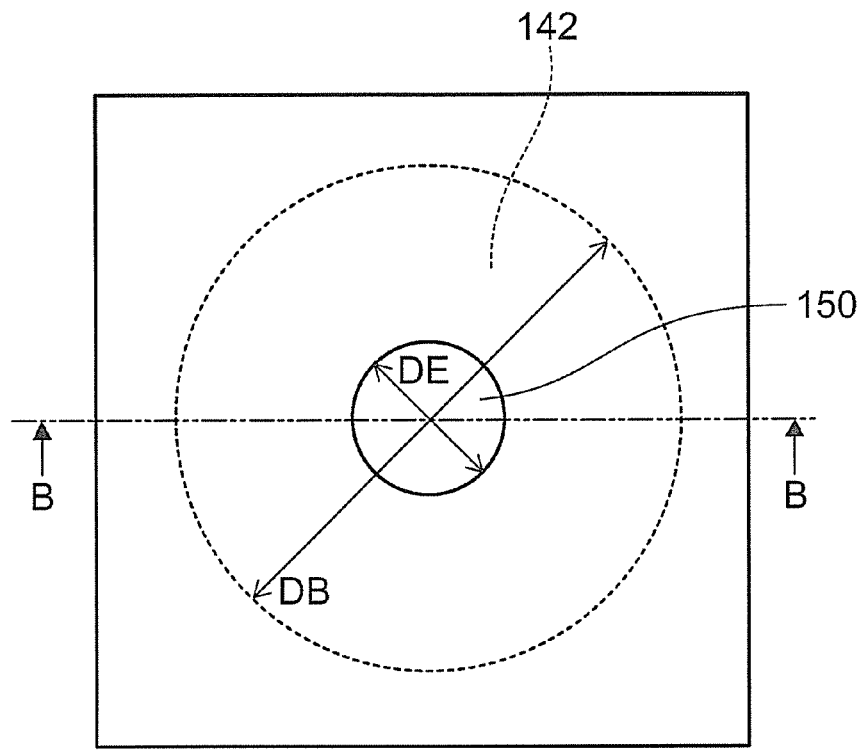
FIG. 4A is a schematic plan view of a light emitting device according to the first comparative example.
Figure 4B:
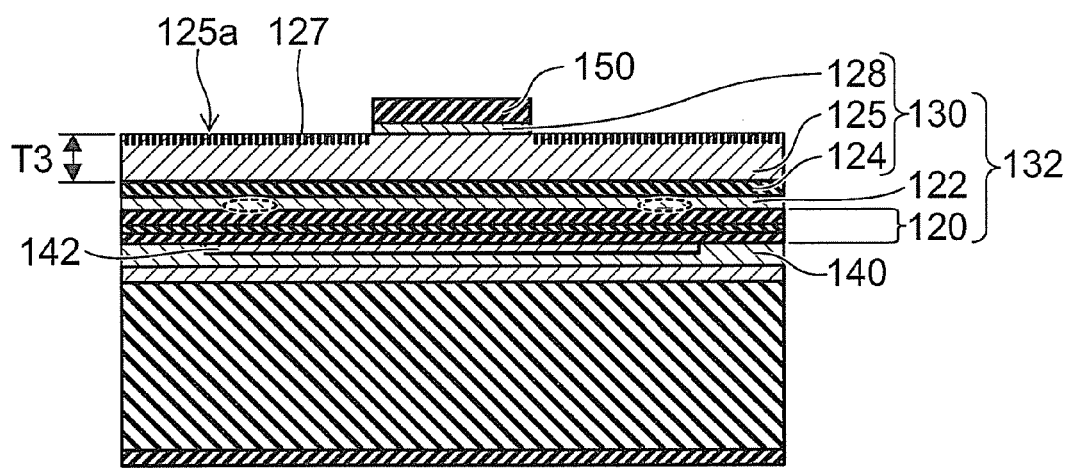
FIG. 4B is a schematic cross-sectional view taken along line B-B.

FIG. 4A is a schematic plan view of a light emitting device according to the first comparative example, and FIG. 4B is a schematic cross-sectional view taken along line B-B.

In the first comparative example, it is assumed that the first conductivity type is n-type and the second conductivity type is p-type. A current spreading layer 125 is provided between a first electrode 150 and a cladding layer 124. The current spreading layer 125 is made of $In_{0.5}(Ga_{0.7}Al_{0.3})_{0.5}P$ with a thickness of 3 μm and an impurity concentration of $8×10^{17}$ cm$^{-3}$. Island-like protruding portions 127 are formed in the upper surface 125a of the current spreading layer 125.

The light emitting layer 122, as well as the cladding layer 124 and the contact layer 128 in the n-type layer 130, the p-type layer 120, the first electrode 150, the second electrode 140, and the current blocking layer 142 are the same as those in the InGaAlP-based light emitting device of the second embodiment.

As shown in FIG. 3B, the optical output residual ratio was about 50% after 168 hours operation and about 40% after 1000 hours operation. In the dry etching process for forming the convex structures 127, crystalline defects are generated in the current spreading layer 125 and increased by the operation. Thus, the optical output is decreased with time.

FIG. 3C shows the optical output residual ratio of the second comparative example. The second layer was made of n-type $In_{0.5}(Ga_{0.6}Al_{0.4})_{0.5}P$. The second impurity concentration N2 was set to $30×10^{17}$ cm$^{-3}$, and the thickness T2 was set to 0.4 μm. The first layer was made of n-type $In_{0.5}(Ga_{0.7}Al_{0.3})_{0.5}P$. The first impurity concentration N1 was set to $8×10^{17}$ cm$^{-3}$, and the thickness T1 was set to 3 μm. The height H of the convex structures 27 was set to 0.5 μm. The optical output residual ratio was 60 to 63% after 168 hours operation and 58 to 61% after 1000 hours operation. In this case, the bottom portion around the convex structures 27 reaches the first layer. That is, in the dry etching process, crystalline defects are generated in the first layer having low impurity concentration. The current passing through this region causes the decrease of optical output.

Figure 5A:
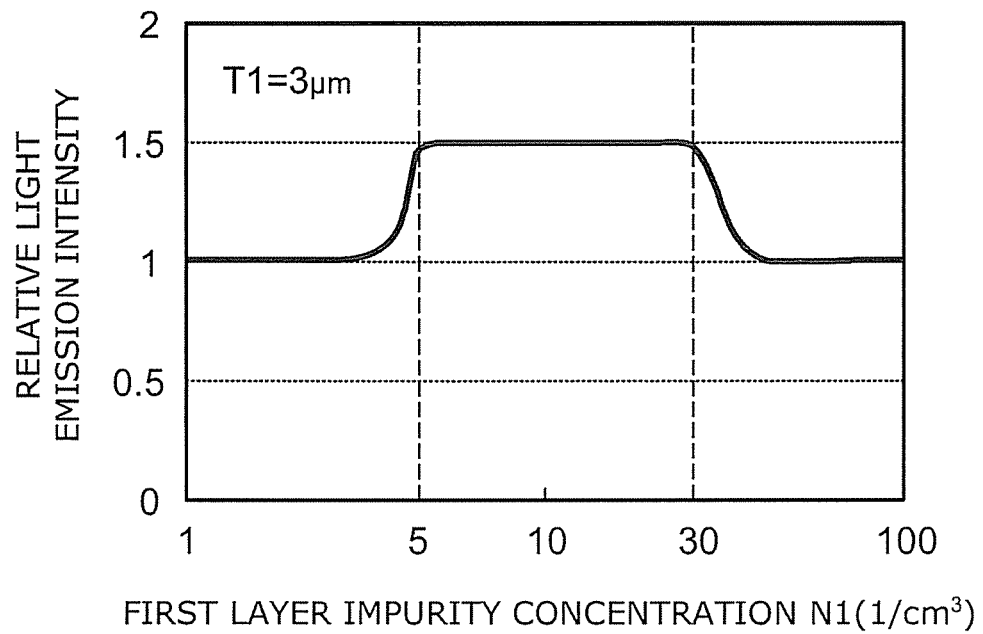
FIG. 5A shows the dependence of relative light emission intensity on the impurity concentration of a first layer.
Figure 5B:
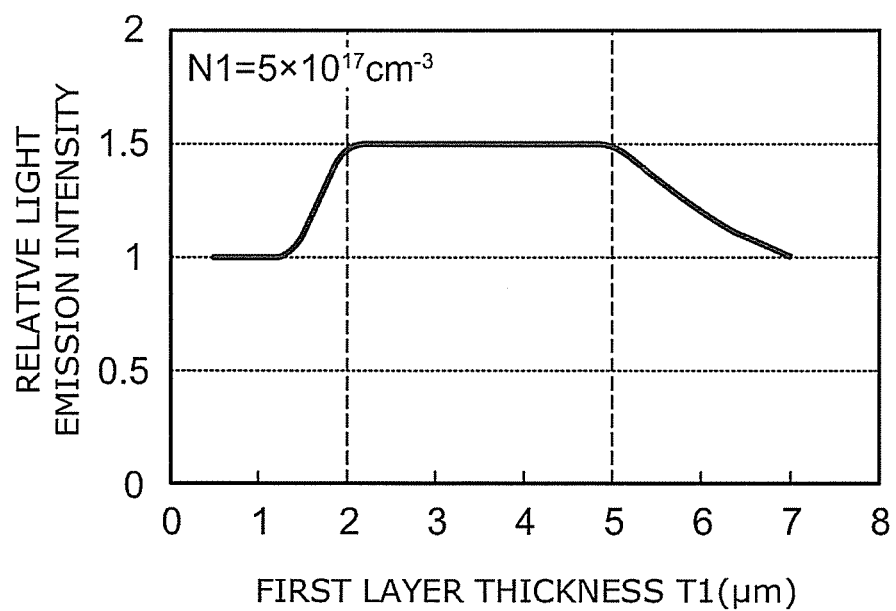
FIG. 5B shows the dependence of relative light emission intensity on the thickness of the first layer.

FIG. 5A shows the dependence of relative light emission intensity on the impurity concentration of the first layer, and FIG. 5B shows the dependence of relative light emission intensity on the thickness of the first layer, both determined in the second embodiment.

For instance, in FIG. 5A, the thickness T1 of the first layer 25 is set to 3 μm. The vertical axis represents relative light emission intensity, and the horizontal axis represents the impurity concentration N1 ($×10^{17}$ cm$^{-3}$) of the first layer 25. When the impurity concentration N1 is set to not less than $5×10^{17}$ cm$^{-3}$, the injected current is sufficiently spread in the first layer 25, and then is sufficiently spread in the light emitting layer. Furthermore, this increases the light which is reflected by the second electrode 40 and can be extracted without being blocked by the first electrode 50. Thus, the light emission intensity can be increased to about 1.5 times as high as that in the case where the impurity concentration N1 of the first layer 25 is $4×10^{17}$ cm$^{-3}$. In an InGaAlP-based material doped with Si having n-type conductivity, the activation rate of Si (the ratio of the carrier concentration to the impurity concentration) is about 1. Hence, it can be considered that the impurity concentration represents the carrier concentration.

In FIG. 5B, the impurity concentration N1 is set to $5 \times 10^{17}$ cm$^{-3}$. The vertical axis represents relative light emission intensity, and the horizontal axis represents the thickness T1 (μm) of the first layer 25, and then is spread in the light emitting layer. When the thickness T1 of the first layer 25 is set to not less than 2 μm, the injected current is sufficiently spread in the first layer 25. Furthermore, this increases the light which is reflected by the second electrode 40 and can be extracted without being blocked by the first electrode 50. Thus, the light emission intensity can be increased to about 1.5 times as high as that in the case where the thickness of the current spreading layer is 1 μm.

Hence, in the InGaAlP-based light emitting device according to the second embodiment, the impurity concentration N1 of the first layer 25 is more preferably set in the range given by formula (1).

$$5 \times 10^{17} \leq N1 (1/cm^3) \tag{1}$$

If the impurity concentration N1 is higher than $30 \times 10^{17}$ cm$^{-3}$, impurity energy levels are formed in the band gap due to the high donor concentration and absorb emitting light. Hence, the optical output decreases. That is, the impurity concentration N1 is more preferably not more than $30 \times 10^{17}$ cm$^{-3}$.

If the thickness T1 of the first layer 25 is larger than 5 μm, the quality of the growth layers is degraded due to the increase of crystalline defects, and then the optical output decreases. That is, the thickness T1 of the first layer 25 is more preferably set in the range given by formula (2).

$$2 \leq T1 (\mu m) \leq 5 \tag{2}$$

If the height H of the convex structures 27 is brought close to the thickness T2 of the second layer 26, the current spreading effect in the lower region of the second layer 26 decreases. In this case, the required current spreading is performed in the first layer 25.

FIG. 3D shows the optical output residual ratio of the third comparative example. The second layer is made of n-type In$_{0.5}$(Ga$_{0.6}$Al$_{0.4}$)$_{0.5}$P. The second impurity concentration N2 is $1 \times 10^{18}$ cm$^{-3}$, and the thickness T2 is 1 μm. The first layer is made of n-type In$_{0.5}$(Ga$_{0.7}$Al$_{0.3}$)$_{0.5}$P. The first impurity concentration N1 is $8 \times 10^{17}$ cm$^{-3}$, and the thickness T1 is 3 μm. The height H of the convex structure is 0.5 μm. The optical output residual ratio was 56 to 64% after 168 hours operation and 55 to 62% after 1000 hours operation. In this case, the bottom portion of the convex structure does not reach the first layer. However, this result reveals that the impurity concentration of the second layer at $1 \times 10^{18}$ cm$^{-3}$ is too low and crystalline defects may increase. That is, it turns out that the impurity concentration N2 is more preferably set in the range given by formula (3) in order to reduce damage in dry etching process. Formula (3) is applicable also to the case where the first layer and the second layer are each made of Al$_x$Ga$_{1-x}$As ($0 \leq x \leq 1$).

$$1.5 \times 10^{18} \leq N2 (1/cm^3) \tag{3}$$

If the second impurity concentration N2 of the second layer 26 is too high, optical absorption may increase due to the impurity energy levels formed in the band gap. That is, the second impurity concentration N2 is more preferably set not more than $50 \times 10^{17}$ cm$^{-3}$.

Figure 6A:
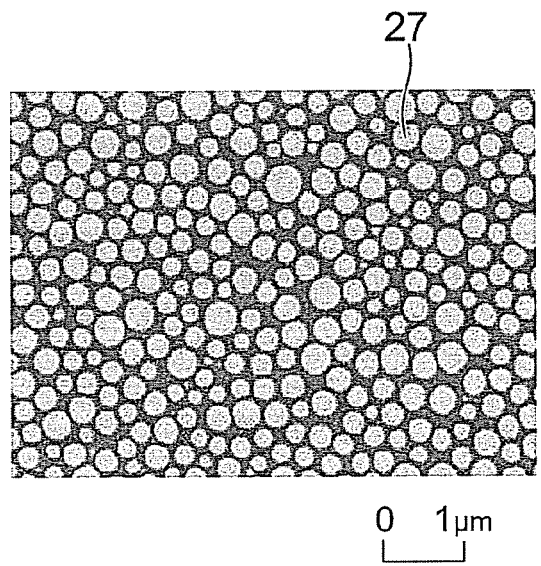
FIG. 6A is a SEM micrograph of the upper surface of island-like convex structures.
Figure 6B:
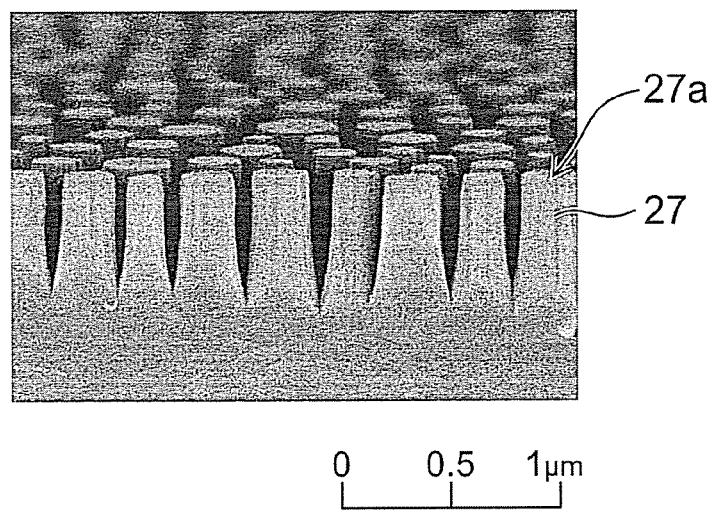
FIG. 6B is a SEM micrograph of the island-like convex structures as viewed from obliquely above.
Figure 6C:
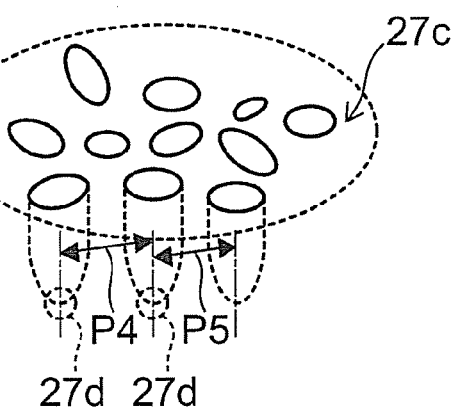
FIG. 6C is a schematic perspective view of mesh-like convex structures.

FIG. 6A is a SEM micrograph of the upper surface of the island-like convex structures made of InGaAlP. FIG. 6B is a SEM micrograph of the island-like convex structures as viewed from obliquely above. FIG. 6C is a schematic perspective view of the mesh-like convex structures.

By performing the dry etching method using a block copolymer as a mask, randomly shaped fine convex structures as shown in the SEM (scanning electron microscope) micrographs of FIGS. 6A and 6B can be formed. FIG. 6B is a SEM micrograph corresponding to the schematic cross-sectional view of FIG. 2B. Each of the plurality of the island-like convex structures 27 can be shaped like a column having a substantially flat region at the upper surface 27a. The bottom portions 27b provided around the convex structures 27 can be sloped.

As shown in FIG. 6C, the mesh-like convex structure 27 has a substantially flat region at the upper surface 27c, and a plurality of bottom portions 27d are provided therearound. Such mesh-like projections 27 can be formed by increasing the relative composition ratio of PS to PMMA in the block copolymer. In the case of the mesh-like convex structures 27, as viewed from the center of one bottom portions 27d provided around the convex structures 27, the minimum of the distances to the centers of the bottom portions 27d therearound is defined as pitches P4, P5, etc. Thus, the average value of the pitches P is defined as the average pitch of the mesh-like convex structures 27.

The average pitch of the convex structures 27 of FIGS. 6A and 6B is smaller than the emission wavelength of the light emitting device. In the case of the red light emitting device, the wavelength is within the range of 610 to 700 nm. In the case of green light emitting device, the wavelength range is around 560 nm. The diameter of the column is in the range of 100 to 200 nm, and the height H of the convex structures 27 is in the range of 200 to 600 nm. It is also possible to form regularly shaped convex structures 27 by using a photoresist mask.

By the configuration as shown in FIGS. 6A to 6C, a graded index can be provided in the depth direction from the surface of the second layer 26, and diffracted light can be extracted upward. Thus, a high light extraction efficiency can be obtained.

Figure 7A:
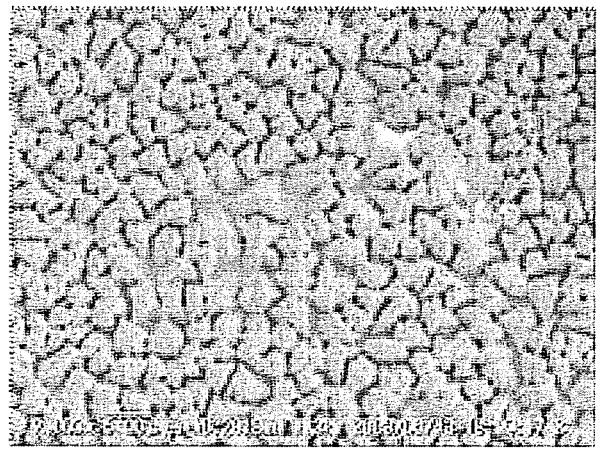
FIGS. 7A and 7B are SEM micrographs of the upper surface of island-like convex structures formed by a wet etching method.
Figure 7B:
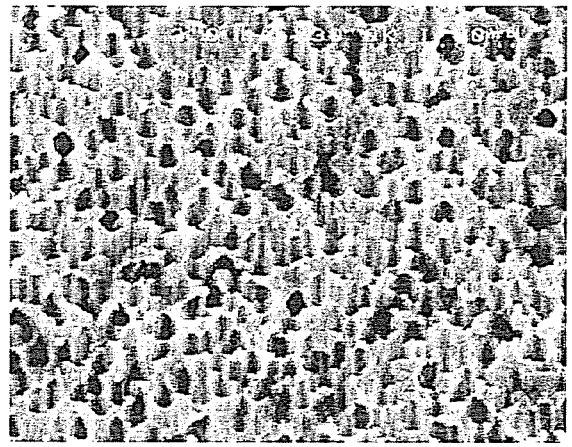
Figure 7C:
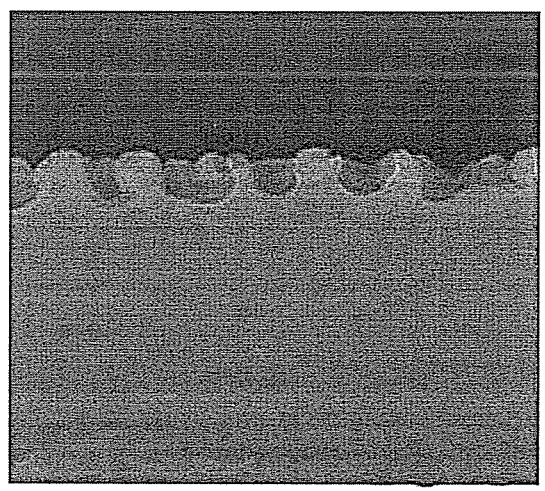
FIG. 7C is a SEM micrograph of the cross section thereof.

FIGS. 7A and 7B are SEM micrographs of the upper portion of island-like convex structures formed by the wet etching method. FIG. 7C is a SEM micrograph of the cross section thereof.

By frost treatment using the wet etching method and the like, it is difficult to form the island-like or mesh-like convex structures having a size smaller than the wavelength. Furthermore, it is also difficult to increase the height of the convex structures. Thus, it is difficult to form a graded index region with good controllability and to form a grating. Furthermore, it is difficult to control the upper surface of the convex structures to be flat.

Figure 8:
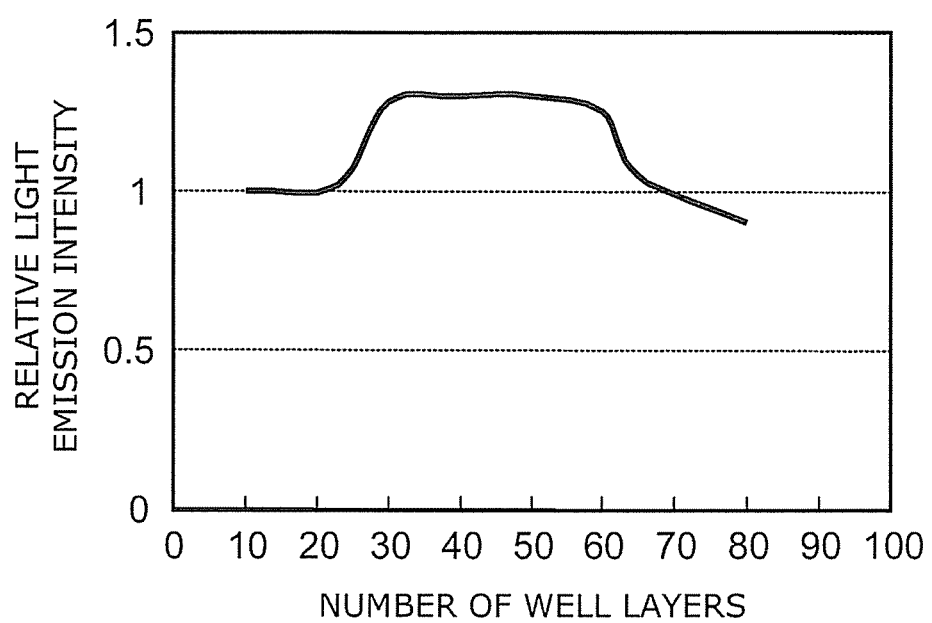
FIG. 8 shows the dependence of relative light emission intensity on the number of MQW wells.

FIG. 8 is shows the dependence of relative light emission intensity on the number of MQW wells.

The vertical axis represents relative light emission intensity, and the horizontal axis represents the number of MQW wells. The solid line represents the InGaAlP-based light emitting device according to the second embodiment. The second layer 26 is made of n-type In$_{0.5}$(Ga$_{0.6}$Al$_{0.4}$)$_{0.5}$P. The second impurity concentration N2 is set to $30 \times 10^{17}$ cm$^{-3}$, and the thickness T2 is set to 1 μm. The first layer 25 is made of n-type In$_{0.5}$(Ga$_{0.7}$Al$_{0.3}$)$_{0.5}$P. The first impurity concentration N1 is set to $8 \times 10^{17}$ cm$^{-3}$, and the thickness T1 is set to 3 μm. Furthermore, the height H of the projection 27 is set to 0.5 μm. In the range of the number of wells of 30 to 60, the light emission intensity of the second embodiment represented by the solid line can be increased to about 1.4 times as high as the light emission intensity of an SQW (single quantum well).

Since the current is sufficiently spread in the plane of the light emitting layer 22 by the first layer 25 in the second embodiment, carriers in each well can be distributed more uniformly in the in-plane and vertical direction of the light emitting layer 22 even with high number of well such as 30 to 60. Hence, the light emission intensity can be increased.

Figure 9A:
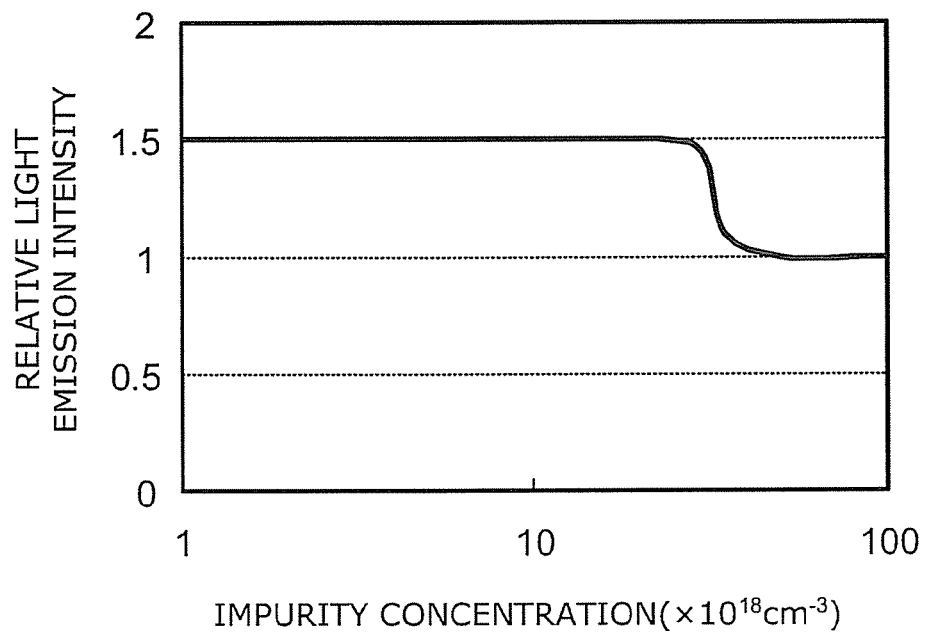
FIG. 9A shows the dependence of relative light emission intensity on the impurity concentration of a p-type contact layer.
Figure 9B:
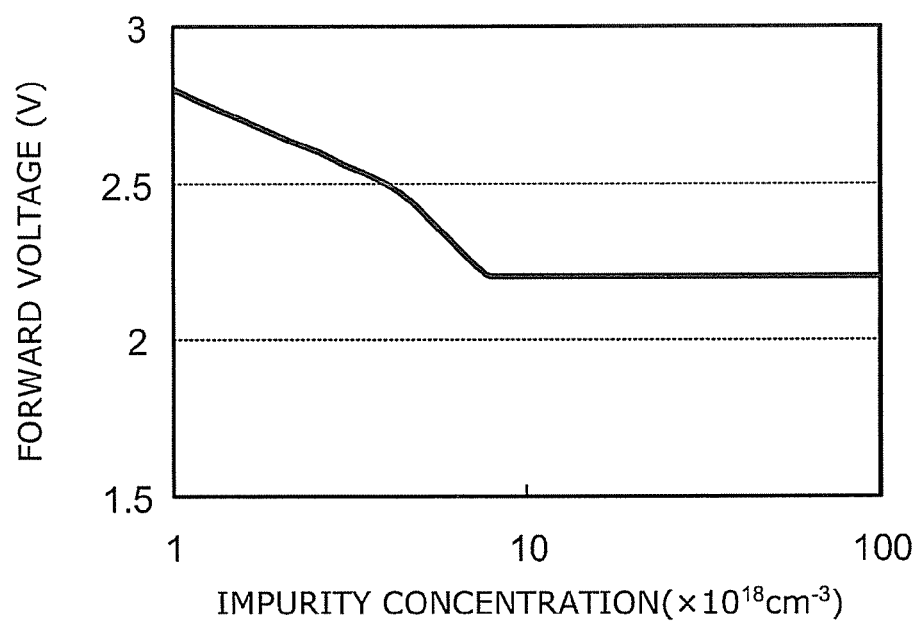
FIG. 9B shows the dependence of forward voltage on the impurity concentration of the p-type contact layer.

FIG. 9A shows the dependence of relative light emission intensity on the impurity concentration of the p-type contact layer. FIG. 9B shows the dependence of forward voltage on the carrier concentration of the p-type contact layer.

As shown in FIG. 9A, if the impurity concentration of the contact layer 14 made of p-type $Al_{0.5}Ga_{0.5}As$ exceeds $30 \times 10^{18}$ cm$^{-3}$, the light emission intensity sharply decreases. This is because, at high impurity concentration, acceptor atoms may form non-radiative levels in the band gap and may absorb emission light.

On the other hand, as shown in FIG. 9B, if the p-type impurity concentration falls below $7 \times 10^{18}$ cm$^{-3}$, the contact resistance to the second electrode 40 increases, and then the forward voltage increases. From these results, the impurity concentration of the contact layer 14 is set to 7 to $30 \times 10^{18}$ cm$^{-3}$. As a result, the light emission intensity can be increased while suppressing the increase of forward voltage.

Next, a third embodiment is described. In the light emitting device of this embodiment, the stacked body 32 is made of a nitride material including $In_xGa_yAl_{1-x-y}N$ (where $x+y \leq 1$).

Figure 10A:
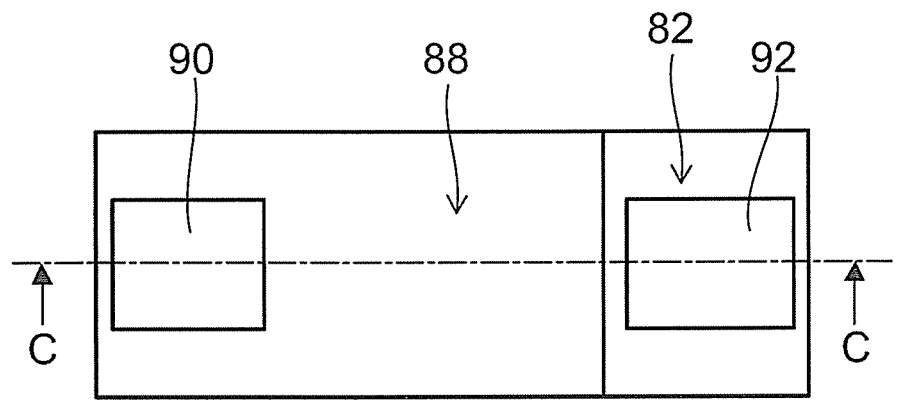
FIG. 10A is a schematic plan view of a light emitting device according to a third embodiment.
Figure 10B:
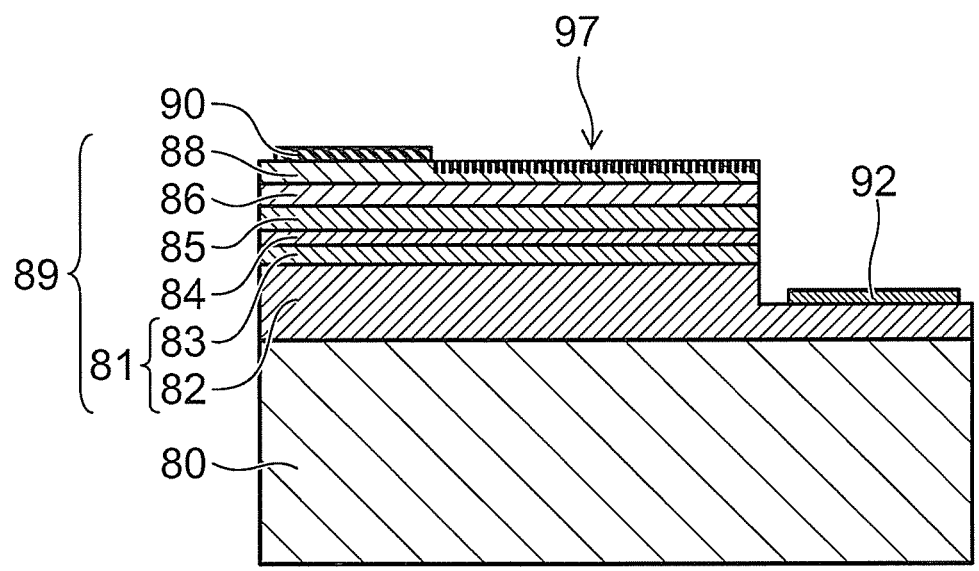
FIG. 10B is a schematic cross-sectional view taken along line C-C.

FIG. 10A is a schematic plan view of the third embodiment, and FIG. 10B is a schematic cross-sectional view taken along line C-C.

The light emitting device includes a substrate 80, a stacked body 89, a first electrode 90, and a second electrode 92.

The stacked body 89 includes $In_xGa_yAl_{1-x-y}N$ (where $0 \leq x \leq 1$, $0 \leq y \leq 1$, $x+y \leq 1$). The emission light is in the wavelength range from ultraviolet to green. The stacked body 89 includes a light emitting layer 84; a cladding layer 85 provided above the light emitting layer 84, having the first conductivity type, and made of e.g. $Al_{0.2}Ga_{0.8}N$; a first layer 86 provided above the cladding layer 85 and having a first impurity concentration of the first conductivity type; and a second layer 88 provided above the first layer 86 and having a second impurity concentration of the first conductivity type higher than the first impurity concentration.

The stacked body 89 further includes a second conductivity type layer 81 provided below the light emitting layer 84 and made of e.g. $Al_{0.2}Ga_{0.8}N$. The second conductivity type layer 81 includes a cladding layer 83 and a contact layer 82. In the case where the substrate 80 is made of sapphire having the insulating property, the second electrode 92 can be provided on the surface of the contact layer 82 on an opposite side of the surface in contact with the substrate 80.

One surface of the first layer 86 includes a formation region and a non-formation region of the first electrode 90. The non-formation region of the first electrode 90 includes the mesh-like or island-like convex structures 97. The average pitch of the projection 97 is smaller than the wavelength of the emission light in the second layer 88.

The embodiments of the invention provide light emitting devices having higher optical output and improved reliability during long-term operation. These light emitting devices can emit light in the visible and infrared light wavelength range, and can be widely used in illumination devices, display devices, traffic lights, sensor device, and so on.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A light emitting device comprising:
a light emitting layer capable of emitting emission light;
a first electrode;
a first layer provided between the light emitting layer and the first electrode, having a first impurity concentration of a first conductivity type, and allowing a carrier injected from the first electrode to be spread in an in-plane direction of the light emitting layer;
a second layer provided between the first layer and the first electrode, having a second impurity concentration of the first conductivity type higher than the first impurity concentration, and including a first surface and a second surface on an opposite side of the first surface, the first surface being with the first layer, the second surface having a formation region and a non-formation region of the first electrode, the formation region of the first electrode not including convex structures, the non-formation region of the first electrode including convex structures with an average pitch not more than a wavelength of the emission light; and
a cladding layer provided between the first layer and the light emitting layer and having an impurity concentration of the first conductivity type,
the convex structures being mesh-like or island-like and having flat regions at an upper surface and bottom portions around the flat regions,
the average pitch being an average value of distances between the bottom portions of mesh-like convex structures, or an average value of distances between the flat regions of island-like convex structures, and
the bottom portions not reaching the first surface.

2. The device according to claim 1, further comprising:
a second conductivity type layer provided on a surface of the light emitting layer on an opposite side of the first layer;
a current blocking layer provided on part of a surface of the second conductivity type layer on an opposite side of the light emitting layer, an outer edge of the current blocking layer being located outward from an outer edge of the first electrode in a plan view; and
a second electrode being with a surface of the current blocking layer on an opposite side of the second conductivity type layer, and being with a region of the surface of the second conductivity type layer not with the current blocking layer, and reflecting part of the emission light.

3. The device according to claim 1, wherein
the light emitting layer and the cladding layer are each made of $In_x(Ga_yAl_{1-y})_{1-x}P$ (where $0 \leq x \leq 1$, $0 \leq y \leq 1$), and
one of the first layer and the second layer is made of $Al_xGa_{1-x}As$ ($0 \leq x \leq 1$), and one other of the first layer and the second layer is made of $In_x(Ga_yAl_{1-y})_{1-x}P$ (where $0 \leq x \leq 1$, $0 \leq y \leq 1$).

4. The device according to claim 3, further comprising:
a second conductivity type layer provided on a surface of the light emitting layer on an opposite side of the first layer;
a current blocking layer provided on part of a surface of the second conductivity type layer on an opposite side of the light emitting layer, an outer edge of the current blocking layer being located outward from an outer edge of the first electrode in a plan view; and a second electrode being with a surface of the current blocking layer on an opposite side of the second conductivity type layer, and being with a region of the surface of the second conductivity type layer not with the current blocking layer, and reflecting part of the emission light.

5. The device according to claim 1, wherein
the light emitting layer and the cladding layer are each made of $In_x(Ga_yAl_{1-y})_{1-x}P$ (where $0 \leq x \leq 1$, $0 \leq y \leq 1$), and
the first layer and the second layer are each made of $Al_xGa_{1-x}As$ ($0 \leq x \leq 1$).

6. The device according to claim 5, further comprising:
a second conductivity type layer provided on a surface of the light emitting layer on an opposite side of the first layer;
a current blocking layer provided on part of a surface of the second conductivity type layer on an opposite side of the light emitting layer, an outer edge of the current blocking layer being located outward from an outer edge of the first electrode in a plan view; and
a second electrode being with a surface of the current blocking layer on an opposite side of the second conductivity type layer, and being with a region of the surface of the second conductivity type layer not with the current blocking layer, and reflecting part of the emission light.

7. A light emitting device comprising:
a light emitting layer capable of emitting emission light;
a first electrode;
a first layer provided between the light emitting layer and the first electrode, having a first impurity concentration of a first conductivity type, and allowing a carrier injected from the first electrode to be spread in an in-plane direction of the light emitting layer;
a second layer provided between the first layer and the first electrode, having a second impurity concentration of the first conductivity type higher than the first impurity concentration, and including a first surface and a second surface on an opposite side of the first surface, the formation region of the first electrode not including convex structures, the first surface being with the first layer, the second surface having a formation region and a non-formation region of the first electrode, the non-formation region of the first electrode including convex structures with an average pitch not more than a wavelength of the emission light; and
a cladding layer provided between the first layer and the light emitting layer and having an impurity concentration of the first conductivity type,
the light emitting layer, the first layer, the second layer, and the cladding layer being each made of $In_x(Ga_yAl_{1-y})_{1-x}P$ (where $0 \leq x \leq 1$, $0 \leq y \leq 1$),
the convex structures being mesh-like or island-like and having flat regions at an upper surface and bottom portions around the flat regions,
the average pitch being an average value of distances between the bottom portions of mesh-like convex structures, or an average value of distances between the flat regions of island-like convex structures, and
the bottom portions not reaching the first surface.

8. The device according to claim 7, wherein the second impurity concentration is not less than $1.5 \times 10^{18}$ cm$^{-3}$.

9. The device according to claim 8, wherein the second impurity concentration is not more than $5 \times 10^{18}$ cm$^{-3}$.

10. The device according to claim 9, wherein
the first layer has a thickness of not less than 2 μm and not more than 5 μm.

11. The device according to claim 10, wherein the first impurity concentration is not less than $5 \times 10^{17}$ cm$^{-3}$ and not more than $3 \times 10^{18}$ cm$^{-3}$.

12. The device according to claim 7, wherein
the first layer has a thickness of not less than 2 μm and not more than 5 μm.

13. The device according to claim 12, wherein the first impurity concentration is not less than $5 \times 10^{17}$ cm$^{-3}$ and not more than $3 \times 10^{18}$ cm$^{-3}$.

14. The device according to claim 7, further comprising:
a second conductivity type layer provided on a surface of the light emitting layer on an opposite side of the first layer;
a current blocking layer provided on part of a surface of the second conductivity type layer on an opposite side of the light emitting layer, an outer edge of the current blocking layer being located outward from an outer edge of the first electrode in a plan view; and
a second electrode being with a surface of the current blocking layer on an opposite side of the second conductivity type layer, and being with a region of the surface of the second conductivity type layer not with the current blocking layer, and reflecting part of the emission light.

15. A light emitting device comprising:
a first electrode;
a stacked body made of $In_xGa_yAl_{1-x-y}N$ (where $0 \leq x \leq 1$, $0 \leq y \leq 1$, $x+y \leq 1$), the stacked body including:
a light emitting layer capable of emitting emission light;
a first layer provided between the light emitting layer and the first electrode, having a first impurity concentration of a first conductivity type, and allowing a carrier injected from the first electrode to be spread in an in-plane direction of the light emitting layer;
a second layer provided between the first layer and the first electrode, having a second impurity concentration of the first conductivity type higher than the first impurity concentration, and including a first surface and a second surface on an opposite side of the first surface, the first surface being with the first layer, the second surface having a formation region and a non-formation region of the first electrode, the formation region of the first electrode not including convex structures, the non-formation region of the first electrode including convex structures with an average pitch not more than a wavelength of the emission light;
a cladding layer provided between the first layer and the light emitting layer and having an impurity concentration of the first conductivity type; and
a third layer having a second conductivity type and provided on a surface of the light emitting layer on an opposite side of a surface provided with the cladding layer; and
a second electrode provided on the third layer exposed to a bottom surface of a step difference provided in the stacked body,
the convex structures being mesh-like or island-like and having flat regions at an upper surface and bottom portions around the flat regions,
the average pitch being an average value of distances between the bottom portions of mesh-like convex structures, or an average value of distances between the flat regions of island-like convex structures, and
the bottom portions not reaching the first surface.

* * * * *